US012805106B2

(12) United States Patent
Shim et al.

(10) Patent No.: US 12,805,106 B2
(45) Date of Patent: Nov. 17, 2026

(54) WAVELENGTH SELF-FILTERING ULTRA-LOW NOISE NEAR INFRARED QUANTUM DOT PHOTODIODE MANUFACTURING METHOD AND NEAR INFRARED QUANTUM DOT PHOTODIODE MANUFACTURED THEREBY

(71) Applicant: KOREA UNIVERSITY RESEARCH AND BUSINESS FOUNDATION, Seoul (KR)

(72) Inventors: Jae Won Shim, Seoul (KR); Tae Hyuk Kim, Seoul (KR)

(73) Assignee: KOREA UNIVERSITY RESEARCH AND BUSINESS FOUNDATION, Seoul (KR)

(*) Notice: Subject to any disclaimer, the term of this patent is extended or adjusted under 35 U.S.C. 154(b) by 313 days.

(21) Appl. No.: 18/758,298

(22) Filed: Jun. 28, 2024

(65) Prior Publication Data

US 2025/0081709 A1 Mar. 6, 2025

(30) Foreign Application Priority Data

Sep. 1, 2023 (KR) ........................ 10-2023-0116287

(51) Int. Cl.

| | |
|---|---|
| ***H10K 30/40*** | (2023.01) |
| ***B82Y 20/00*** | (2011.01) |
| ***H10F 39/00*** | (2025.01) |
| ***H10F 39/18*** | (2025.01) |
| ***H10F 77/20*** | (2025.01) |
| ***H10K 30/82*** | (2023.01) |
| ***H10K 71/60*** | (2023.01) |

(52) U.S. Cl.

CPC .............. *H10K 30/40* (2023.02); *B82Y 20/00* (2013.01); *H10F 39/184* (2025.01); *H10F 39/8057* (2025.01); *H10F 77/244* (2025.01); *H10K 30/82* (2023.02); *H10K 71/60* (2023.02)

(58) Field of Classification Search

CPC ....... H10F 39/8057; H10F 77/331-337; H10F 77/244; H10K 30/82

See application file for complete search history.

(56) References Cited

FOREIGN PATENT DOCUMENTS

KR 10-2564054 B1 8/2023

OTHER PUBLICATIONS

Jin Beom Kwon et al., "High Sensitivity Shortwave Infrared Photodetector Based on PbS QDs Using P3HT", Nanomaterials, Oct. 12, 2021, 11(10), 2683, Total 8 pages.

*Primary Examiner* — Amar Movva

(74) *Attorney, Agent, or Firm* — Hauptman Ham, LLP

(57) ABSTRACT

The present invention discloses a wavelength self-filtering ultra-low noise near infrared quantum dot photodiode manufacturing method and a near infrared quantum dot photodiode manufactured thereby. According to the present invention, a near infrared (NIR) quantum dot photodiode includes: a transparent electrode through which visible light and near-infrared light pass; a p-type layer that is formed on the transparent electrode to shield the visible light; a quantum dot light absorption layer that is formed on the p-type layer to a preset thickness or more to generate excitons through the near-infrared light; an n-type layer that moves negative charges generated by the excitons; and an upper electrode that is formed on the n-type layer.

8 Claims, 14 Drawing Sheets

WAVELENGTH SELF-FILTERING ULTRA-LOW NOISE NEAR INFRARED QUANTUM DOT PHOTODIODE MANUFACTURING METHOD AND NEAR INFRARED QUANTUM DOT PHOTODIODE MANUFACTURED THEREBY

CROSS-REFERENCE TO RELATED APPLICATION

This application claims under 35 U.S.C. § 119 (a) the benefit of Korean Patent Application No. 10-2023-0116287 filed on Sep. 1, 2023, the entire contents of which are incorporated herein by reference.

BACKGROUND

(a) Technical Field

The present invention relates to a wavelength self-filtering ultra-low noise near infrared quantum dot photodiode manufacturing method and a near infrared quantum dot photodiode manufactured thereby.

(b) Background Art

A near infrared (NIR) photodiode (PD) is in the spotlight as a device that plays a pivotal role in a variety of applications since it is capable of selective near infrared detection to be highly desirable for tissue penetration depth, specific molecule absorption, and remote detection purpose.

An indium gallium arsenide (InGaAs) photodiode has been widely used due to their numerous advantages, such as high NIR quantum efficiency and durability.

However, since the indium gallium arsenide (InGaAs) photodiode has limitations, such as the inability to selectively detect NIR light without an external optical filter, high cost, and complex process, it is hindering adoption in several new NIR applications.

To overcome these obstacles, photodiodes manufactured using a variety of materials (e.g., organic material, perovskite, and quantum dot materials) are being actively researched.

Among these, a solution-processed NIR quantum dot photodiode (QPD) is particularly attractive due to its size-dependent bandgap tunability and shows the ability to generate a high-resolution NIR image sensor due to its excellent NIR absorption coefficient.

This technology may serve to eliminate the need for external optical filters, and at the same time, protect against damage caused by exposure to intense visible light (e.g., sunlight or bright artificial light), thereby reducing energy dissipation and eliminating complexity of external circuits.

Recently, an innovative approach called "self-filtering" has been introduced by manipulating a dissociation of Frankel excitons by exploiting intrinsic properties of organic material.

In addition, an internal filtering approach to design organic and perovskite materials into a photodiode having a tandem structure has been reported.

However, most of these studies have generally focused on NIR detection in a limited range less than 900 nm.

In addition, research on internal optical filtering of the NIR quantum dot photodiode has not yet been reported.

RELATED ART DOCUMENT

Patent Document

KR Patent No. 10-2564054

SUMMARY OF THE DISCLOSURE

To solve the above problems of the related art, it is an object of the present invention to provide a wavelength self-filtering ultra-low noise near infrared quantum dot photodiode manufacturing method capable of internal optical filtering and a near infrared quantum dot photodiode manufactured thereby.

To achieve the above objects, according to an aspect of the present invention, provided is a near infrared (NIR) quantum dot photodiode, including: a transparent electrode through which visible light and near-infrared light pass; a p-type layer that is formed on the transparent electrode to shield the visible light; a quantum dot light absorption layer that is formed on the p-type layer to a preset thickness or more to generate excitons through the near-infrared light; an n-type layer that moves negative charges generated by the excitons; and an upper electrode that is formed on the n-type layer.

The p-type layer may be composed of one of PM6, P3HT, PTB7, PM7, D18, and PPDT2FBT.

The quantum dot light absorption layer may be formed based on PbS.

The p-type layer may be formed to a thickness of 500 to 750 nm.

To determine an optimal thickness of the p-type layer, at least one of reverse dark current density, leakage current density, defect density, state trap density, capacitance, and shunt resistance may be measured for various p-type layer thicknesses.

White noise and thermal noise may be reduced by the optimal thickness of the p-type layer.

The p-type layer may function as an internal optical filter by the optimal thickness of the p-type layer.

According to another aspect of the present invention, provided is a near infrared (NIR) quantum dot photodiode manufacturing method, including the steps of: forming a transparent electrode through which visible light and near-infrared light pass; forming a p-type layer shielding the visible light on the transparent electrode; forming a quantum dot light absorption layer generating excitons through the near-infrared light to a preset thickness or more; forming an n-type layer moving negative charges generated by excitons on the quantum dot light absorption layer; and forming an upper electrode on the n-type layer.

According to the present invention, by providing the organic semiconductor layer of a predetermined thickness or more as an internal optical filter to self-shield visible light, it is possible to perform the selective near-infrared light detection, thereby obtaining the advantage of being applicable to various NIR applications.

In addition, according to the present invention, it is possible to achieve a low noise level by reducing the state trap density through the application of the organic semiconductor layer of a predetermined thickness or more.

DETAILED DESCRIPTION

Figure 1:
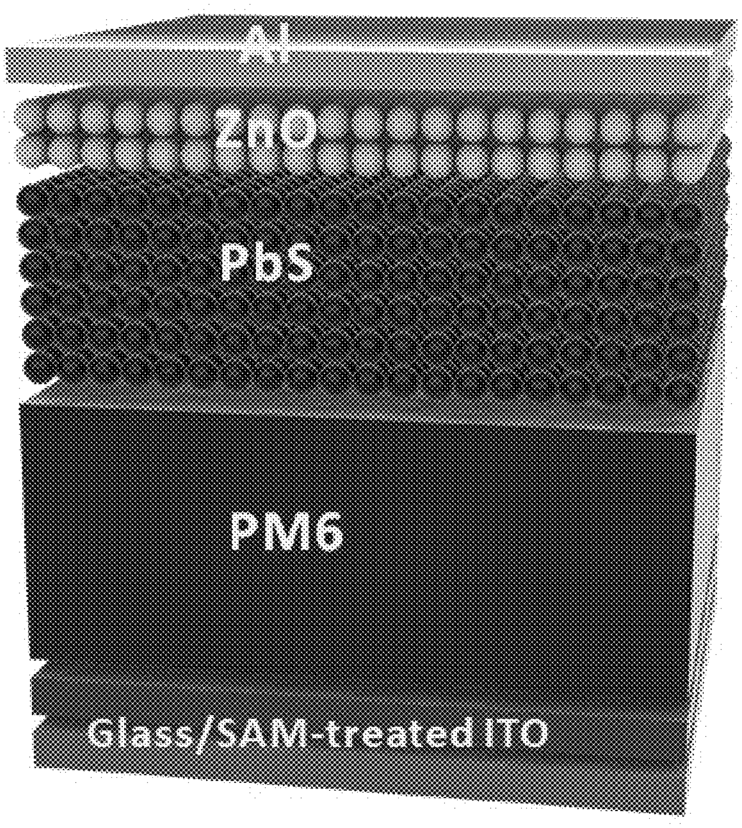
FIG. 1 is a diagram illustrating a configuration of an NIR quantum dot photodiode according to the present embodiment.

The present invention may be variously modified and have several embodiments, and thus, specific embodiments will be illustrated in the drawings and described in detail.

However, it is to be understood that the present invention is not limited to a specific embodiment, but includes all modifications, equivalents, and substitutions within the scope and spirit of the present invention.

FIG. 1 is a diagram illustrating a configuration of an NIR quantum dot photodiode according to the present embodiment.

As illustrated in FIG. 1, the NIR quantum dot photodiode according to the present embodiment may include a transparent electrode 100, a p-type layer 102, a quantum dot light absorption layer 104, an n-type layer 106, and an upper electrode 108.

The transparent electrode 100 may be made of Glass/SAM-treated ITO.

The p-type layer 102 is an organic semiconductor layer that blocks electrons and moves holes, and may be a p-type organic semiconductor layer.

The p-type layer 102 may be made of one of PM6, P3HT, PTB7, PM7, D18, and PPDT2FBT, but is preferably made of PM6.

According to a preferred embodiment of the present invention, a thickness of the p-type layer 102 is preferably 500 to 750 nm, and more preferably 680 nm.

Hereinafter, it will be described that the p-type layer 102 according to the present embodiment is a PM6 layer.

The p-type layer according to the present embodiment increases a short-wavelength absorption coefficient through thickness control, shields visible light from the NIR quantum dot photodiode, and also reduces noise.

The quantum dot light absorption layer according to the present embodiment receives near-infrared light among visible light and near-infrared light transmitted through the transparent electrode 100 and generates excitons. The excitons are separated into positive charges (holes) and negative charges (electrons), the holes move to the transparent electrode 100, and the electrons move to an upper electrode 108.

It corresponds to an intrinsic semiconductor layer in the PIN structure and may be made of PbS.

The PbS-based quantum dot light absorption layer (PbS QDs) may be configured to have a narrow band gap through quantum dot size control to absorb NIR 980 and 1310 nm.

The n-type layer 106 is a layer that moves electrons to the upper electrode 108, and may be made of zinc oxide (ZnO).

The upper electrode 108 may be made of aluminum.

Figure 2:
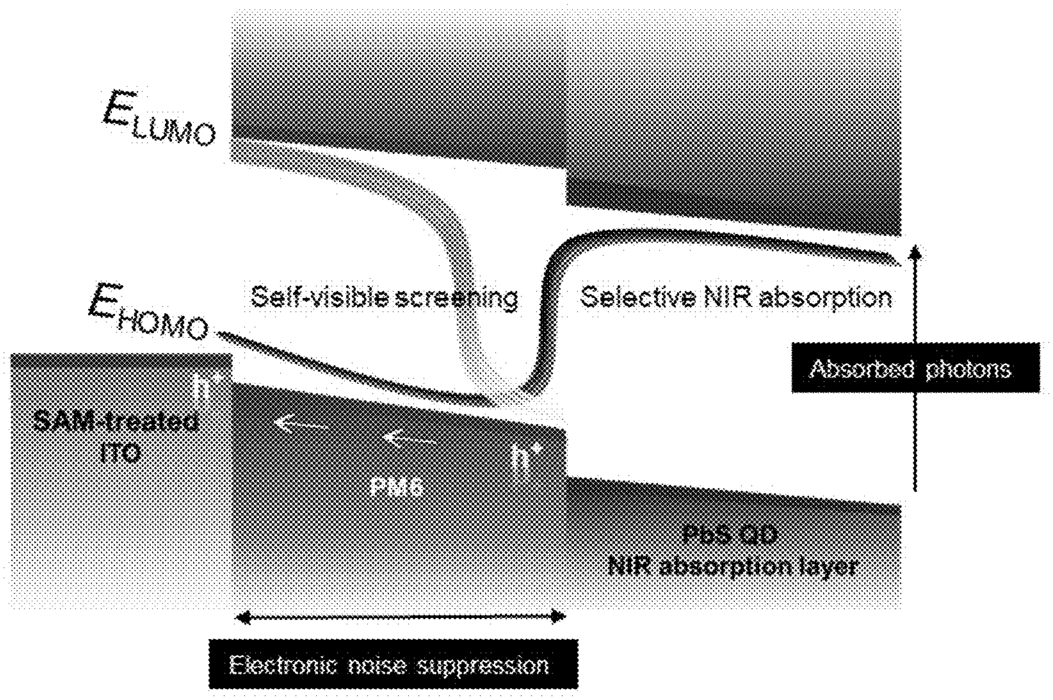
FIG. 2 is a diagram illustrating a wavelength self-screening mechanism of the NIR quantum dot photodiode according to the present embodiment.

FIG. 2 is a diagram illustrating a wavelength self-screening mechanism of the NIR quantum dot photodiode according to the present embodiment.

FIG. 2 illustrates an example of the use of PbS QDs/ZnO heterojunction to generate built-in potentials by effectively utilizing an electron blocking function of the organic semiconductor layer.

Light introduced through the transparent electrode is almost completely absorbed within the PM6 layer, and low-energy photons penetrate into the PbS quantum dot light absorption layer.

For reference, the PM6 layer has a high absorption coefficient for visible light, and the PM6 layer plays a critical role in eliminating the formation of unwanted 'poor' Frenkel excitons.

Thereafter, the PbS quantum dot light absorption layer with a narrow band gap ensures complete absorption of pure NIR wavelengths.

Figure 3:
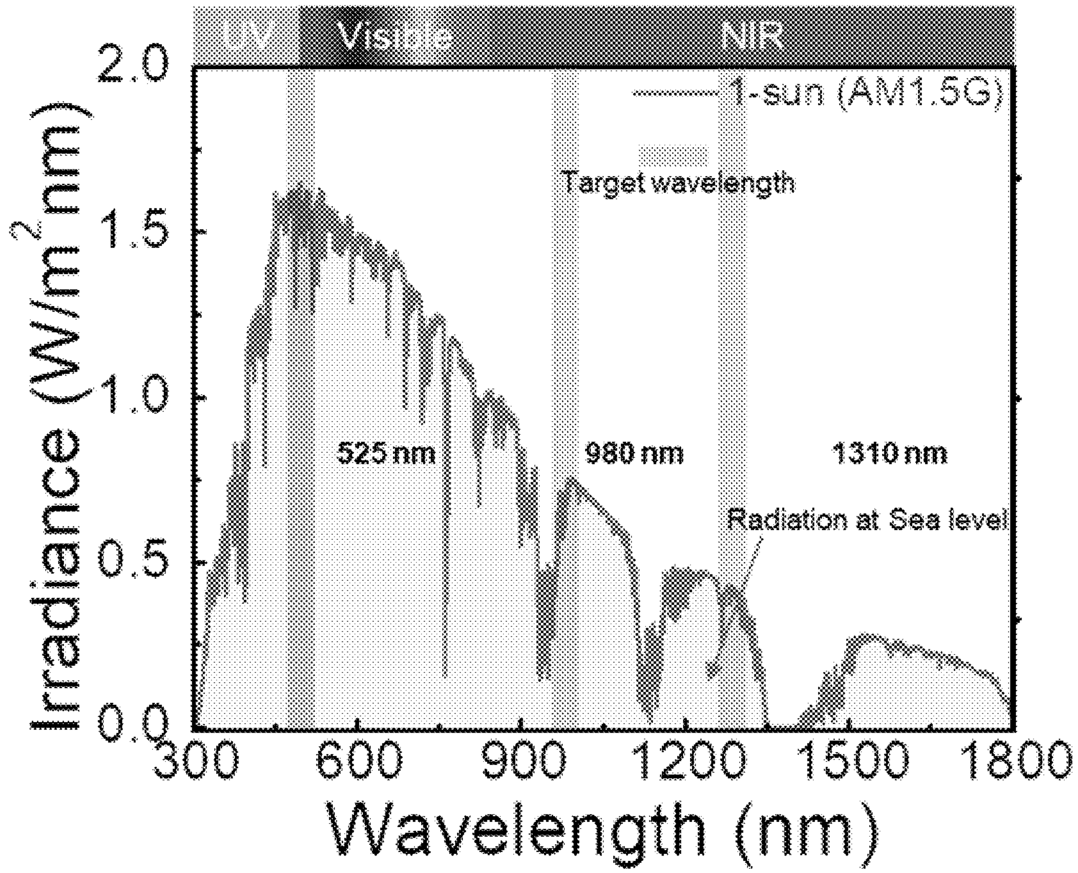
FIG. 3 is a diagram illustrating a target wavelength band within a solar radiation spectrum of the NIR quantum dot photodiode according to the present embodiment.

FIG. 3 is a diagram illustrating a target wavelength band within a solar radiation spectrum of the NIR quantum dot photodiode according to the present embodiment.

FIG. 3 illustrates the importance of shielding the visible light to achieve selective NIR absorption in the solar radiation spectrum.

In FIG. 3, wavelengths with low photon energies (NIR wavelengths of $\lambda$=980 and 1310 nm and visible light wavelengths of $\lambda$=525 nm) are used for performance evaluation.

FIGS. 4A to 4I are diagrams illustrating voltage-current characteristics of the NIR quantum dot photodiode.

Figure 4A:
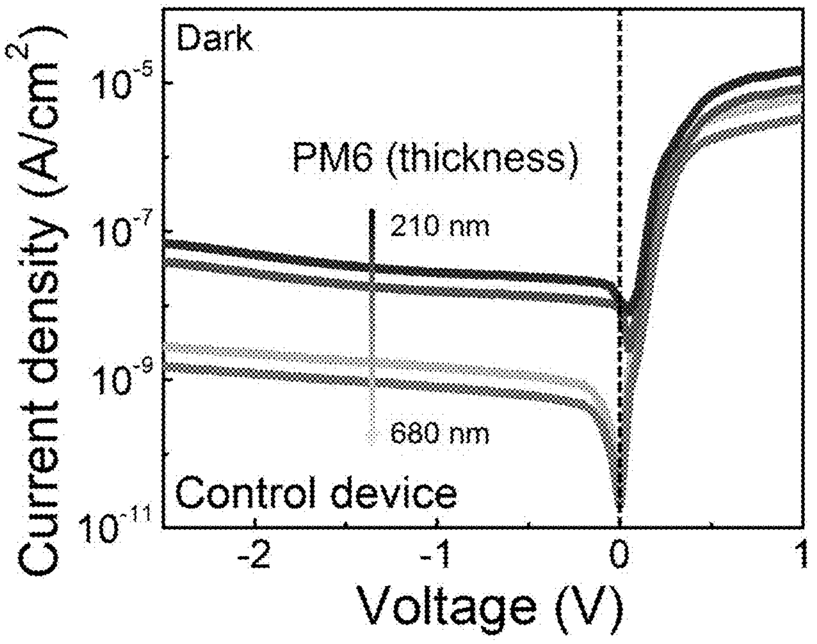
FIGS. 4A to 4I are diagrams illustrating voltage-current characteristics of the NIR quantum dot photodiode.

FIG. 4A is a diagram illustrating J-V characteristics of reverse dark current density of the NIR quantum dot photodiode.

Referring to FIG. 4A, it can be seen that a bias limited to −2.5 to 1V illustrates significant dependence on the thickness of the PM6 layer.

As the thickness of the PM6 layer increases, a dark current density effectively decreases due to the increased electron blocking.

Figure 4B:
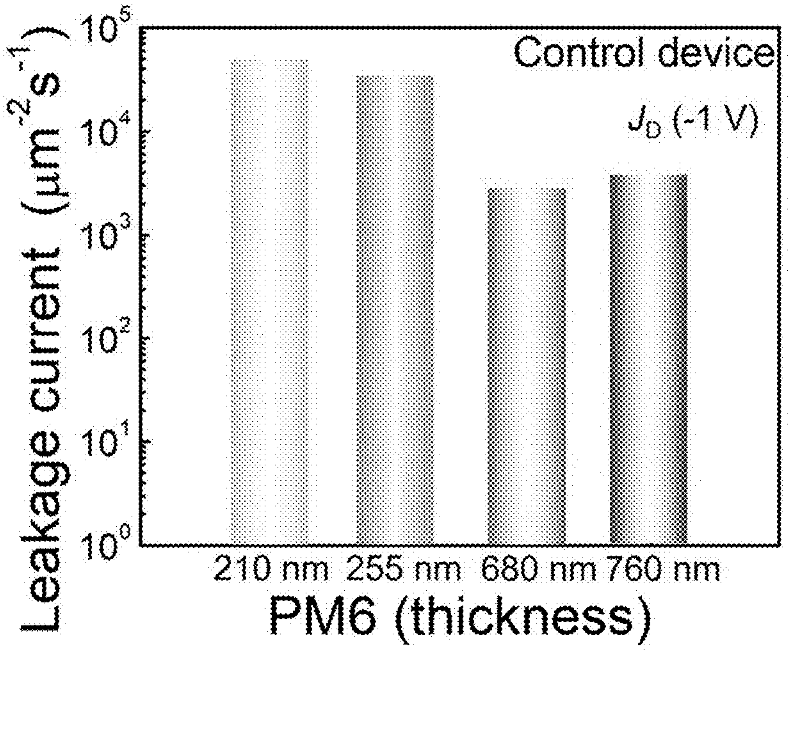

FIG. 4B is a diagram illustrating a leakage current density of the NIR quantum dot photodiode under various PM6 layer thickness conditions.

FIG. 4B illustrates the leakage current density for various PM6 layer thicknesses at a bias of −1V. The leakage current density for a thick PM6 layer (about 680 nm) is $2.0\times10^{3}$ $\mu m^{-2}s^{-1}$, which is an order of magnitude smaller ($4.3\times10^{4}$ $\mu m^{-2}s^{-1}$) than the thin PM6 layer (about 210 nm).

Figure 4C:
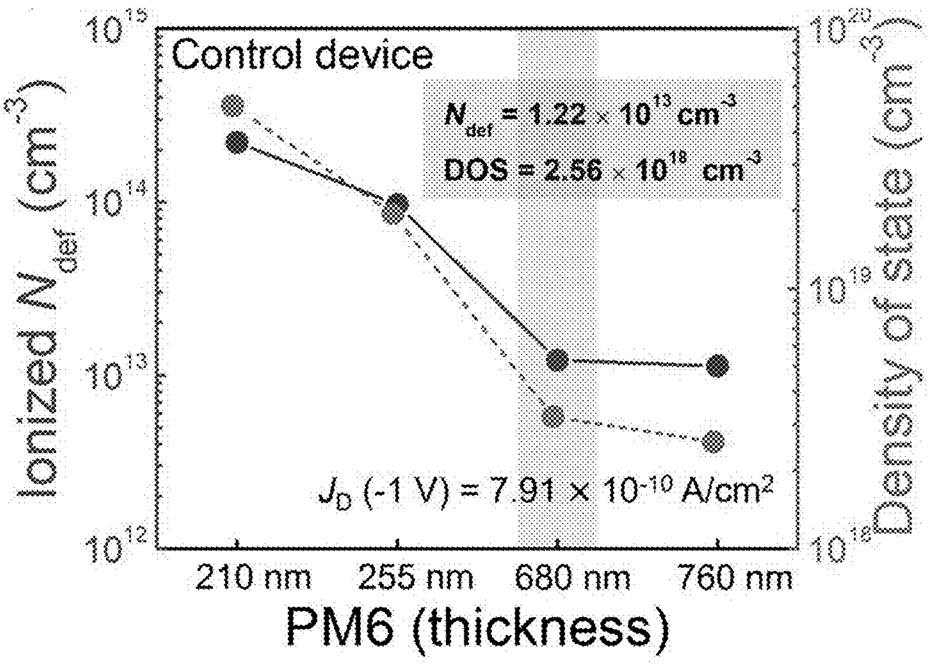

FIG. 4C is a diagram illustrating a defect density (left axis) and a state trap density (right axis) at various PM6 layer thicknesses.

Referring to FIG. 4C, the increase in the PM6 layer thickness is correlated with the decrease in the state trap density, leading to a decrease in ionization defect density.

In general, a decrease in film thickness in organic semiconductors increases a proportion of an amorphous phase, thereby increasing the state trap density. Therefore, it can be seen that in the thick PM6 layer, the presence of the amorphous phase is reduced to minimize structural defects, thereby reducing the state trap density.

Figure 4D:
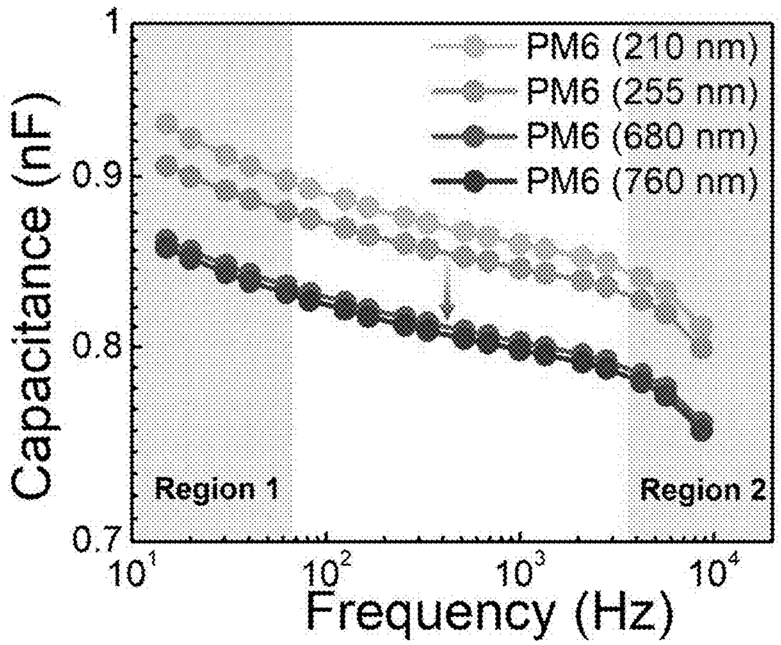

FIG. 4D illustrates capacitance as a function of frequency for various PM6 layer thickness conditions.

The capacitance is primarily controlled by defect sites, except the case in which it may be affected by series resistance components.

In particular, the capacitance decreases as the PM6 layer thickness increases, which illustrates a strong correlation with charge trapping and de-trapping events and experimentally demonstrates the effect of the reduced dark current in the thicker PM6 layer.

Figure 4E:
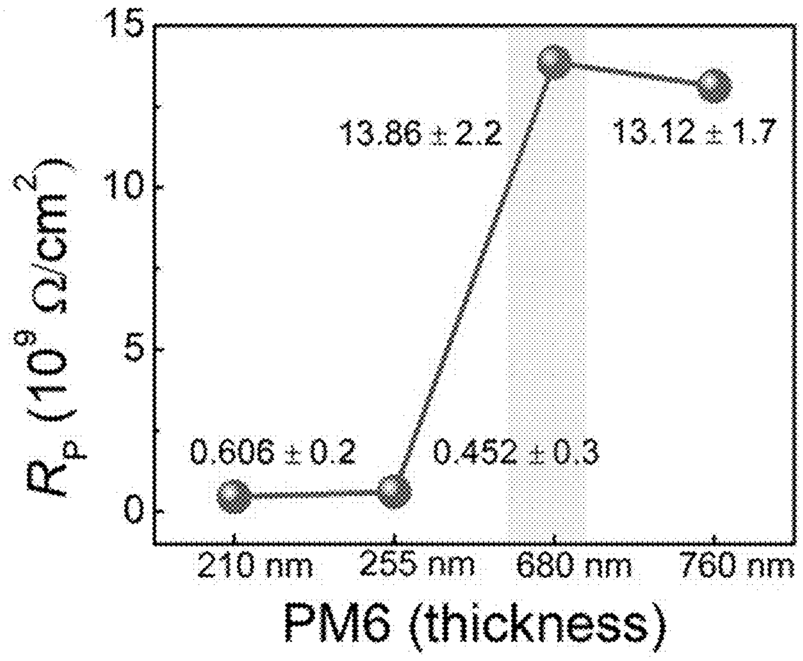

FIG. 4E is a diagram illustrating a shunt resistance.

Referring to FIG. 4E, the shunt resistance of the thick PM6 layer (about 680 nm) shows a relatively high value of 14 gigaohms or more, while the thin PM6 layer (about 215 nm) shows a size that is 20 times smaller.

Through this, it can be seen that the high shunt resistance of the thick PM6 layer limits the flow of current through the external circuit to reduce the dark current value.

Figure 4F:
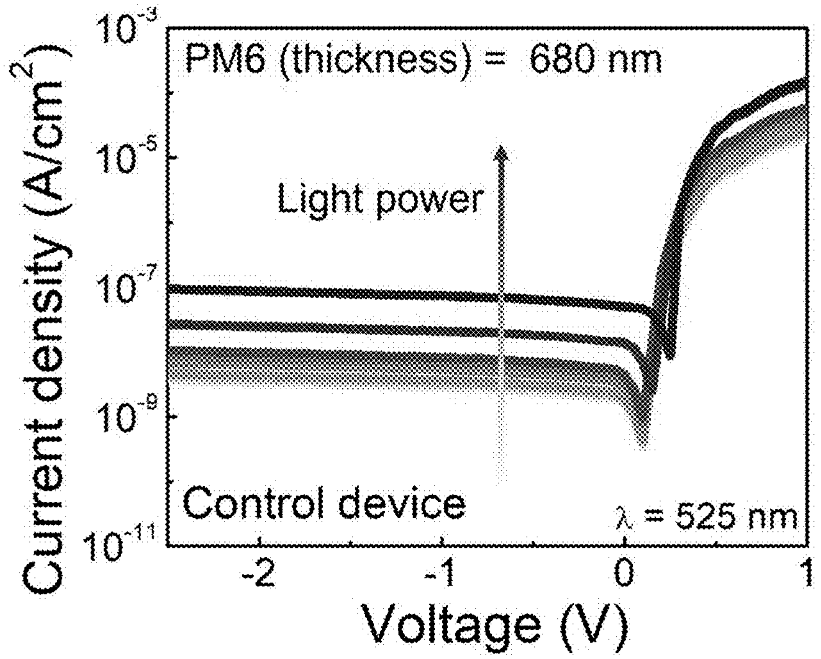

FIG. 4F is a diagram illustrating J-V characteristics of the NIR quantum dot photodiode.

Referring to FIG. 4F, the photocurrent density value at λ=525 nm is maintained without significant change even at various illuminance levels, and represents a low value of $8.5\times10^{-8}$ A/cm$^2$, which is similar to the dark current density of 31.8 mW/cm$^2$ that is the highest illuminance level. These results may be interpreted as a strong self-filtering effect where the thick PM6 layer minimizes the visible light absorption.

Figure 4G:
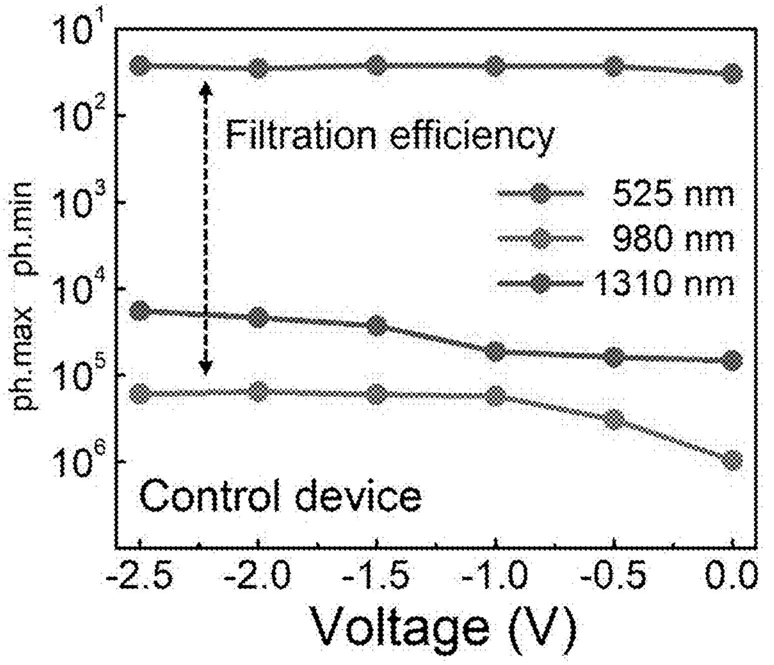
Figure 4H:
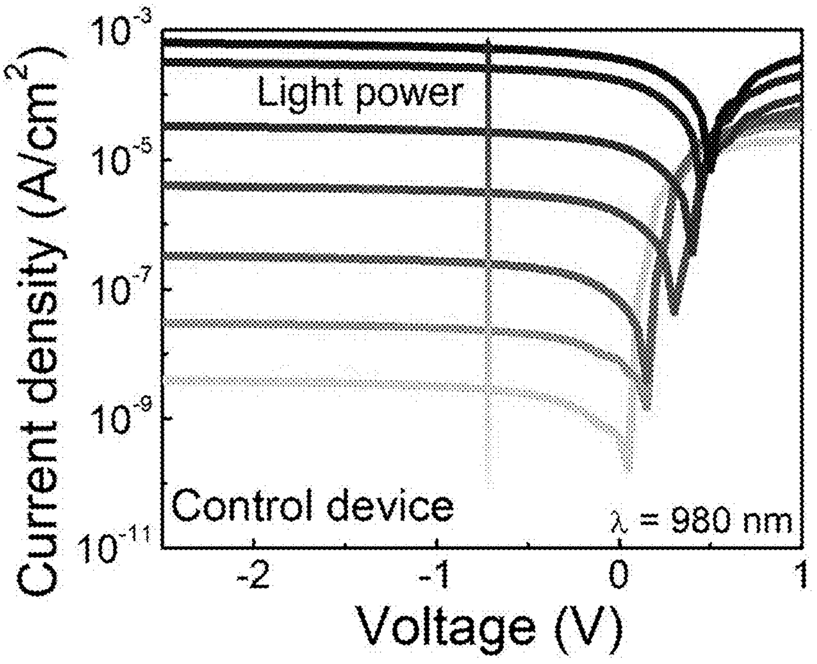
Figure 4I:
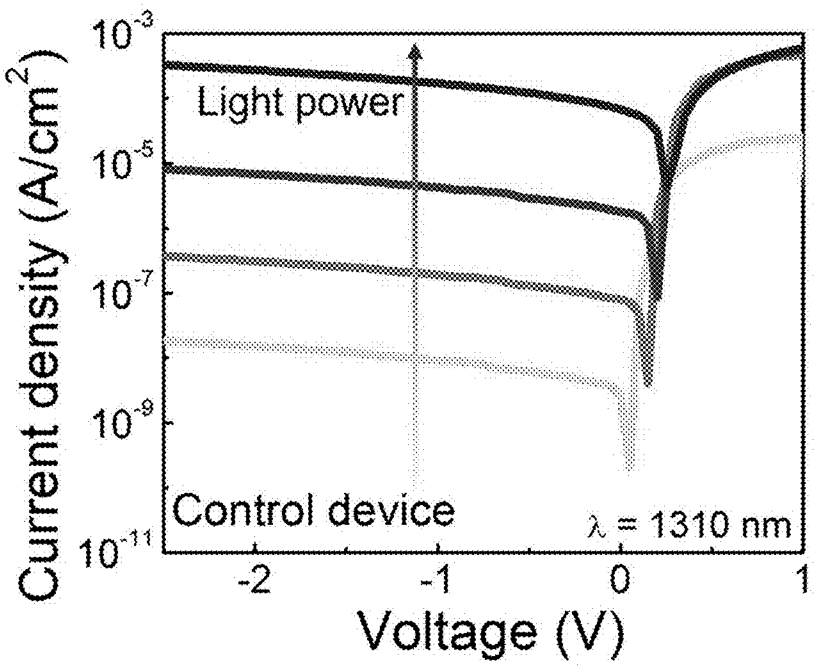

FIGS. 4G to 4I are diagrams illustrating the self-filter characteristics of the quantum dot photodiode at the NIR wavelength and the photocurrent density under λ=980 nm and 1310 nm.

Referring to FIGS. 4H and 4I, the photocurrent density in the NIR region (at λ=980 and 1310 nm) shows a significant difference of approximate 105 A/cm$^2$ between the lowest and highest illuminance levels (Iph.max/Iph.min) at V→−1 V.

FIGS. 5A to 5E are diagrams illustrating the characteristics of the NIR quantum dot photodiode according to the present embodiment and the existing device.

Figure 5A:
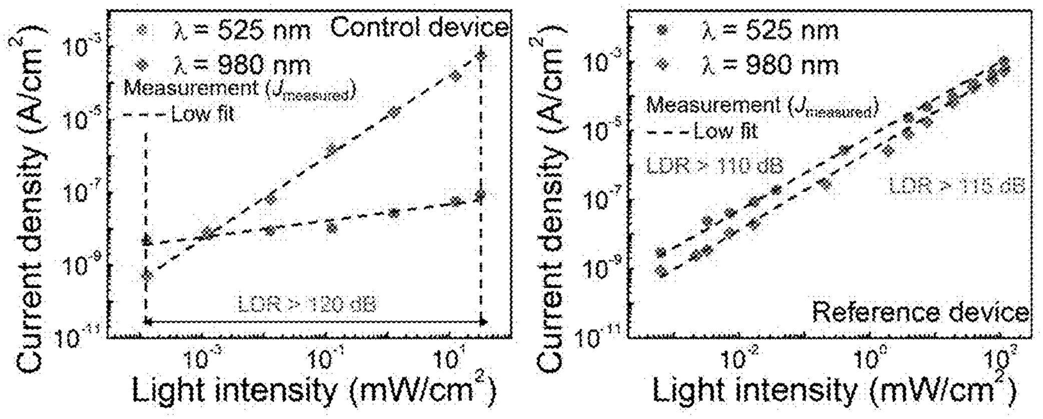
FIGS. 5A to 5E are diagrams illustrating the characteristics of the NIR quantum dot photodiode according to the present embodiment and the existing device.

FIG. 5A illustrates a linear dynamic range measured under visible light (525 nm) and near infrared (980 nm).

The left side of FIG. 5A is the NIR quantum dot photodiode (control device) according to the present embodiment, and the right side is the existing NIR quantum dot photodiode (reference device).

Here, the existing NIR quantum dot photodiode is made of ITO/ZnO/PbS-I/PbS-EDT/Au.

Referring to FIG. 5A, due to the influence of the internal optical filter on the visible light, the NIR quantum dot photodiode according to the present embodiment has a low linear operating range of <21.4 dB>, whereas the existing device has a linear operating range exceeding 120 dB at 980 nm.

Figure 5B:
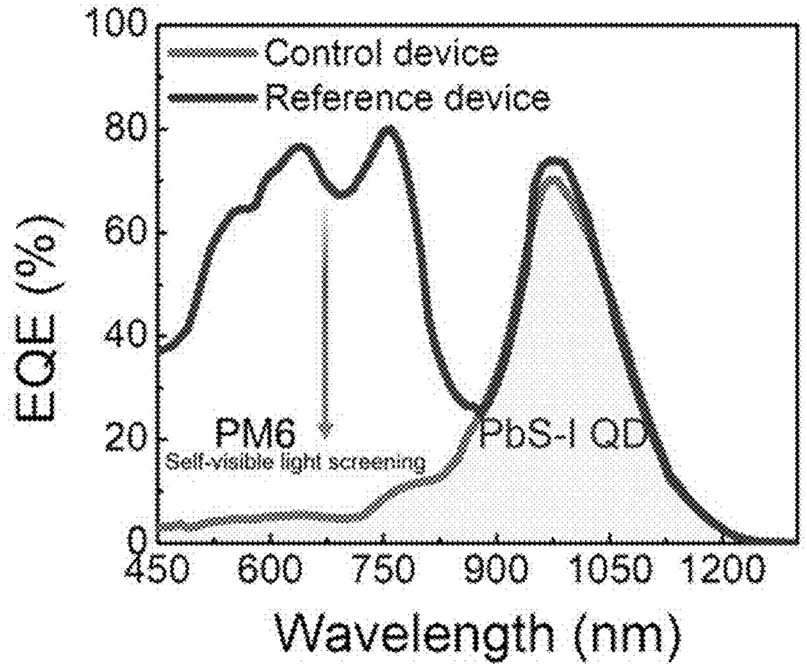

FIG. 5B is a diagram illustrating an external quantum efficiency (EQE) curve of the existing device of the device according to the present embodiment.

Referring to FIG. 5B, the external quantum efficiency of the NIR quantum dot photodiode according to the present embodiment in the short wavelength region is 3 to 4%, which shows a sharp decrease compared to the existing device, which proves the effective visible light shielding effect for selective near-infrared detection.

Figure 5C:
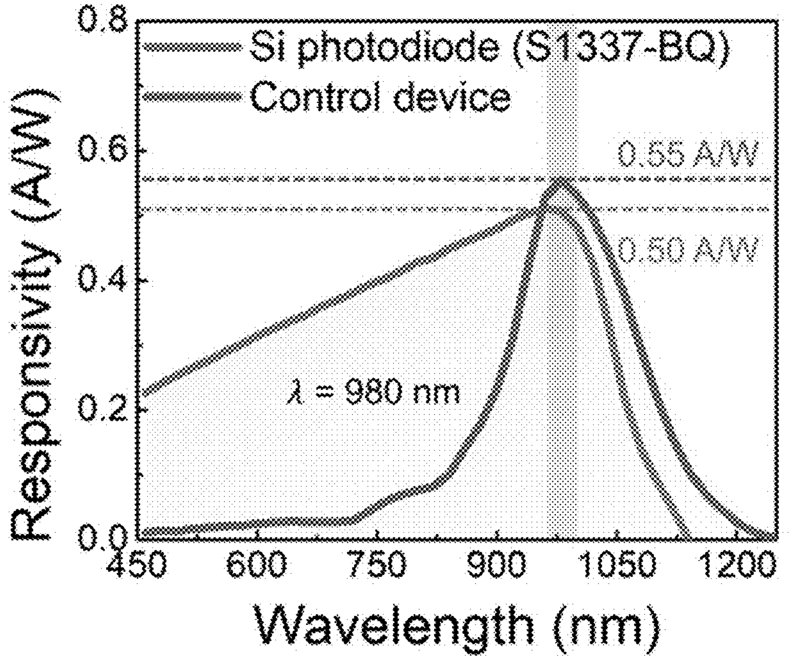

FIG. 5C is a diagram comparing the reactivity of a commercially available Si photodiode and the photodiode according to the present embodiment.

Referring to FIG. 5C, according to the present embodiment, the NIR quantum dot photodiode obtains the responsivity of 0.55 A/W, which is higher than that of the Si photodiode in the 980 nm wavelength band.

Figure 5D:
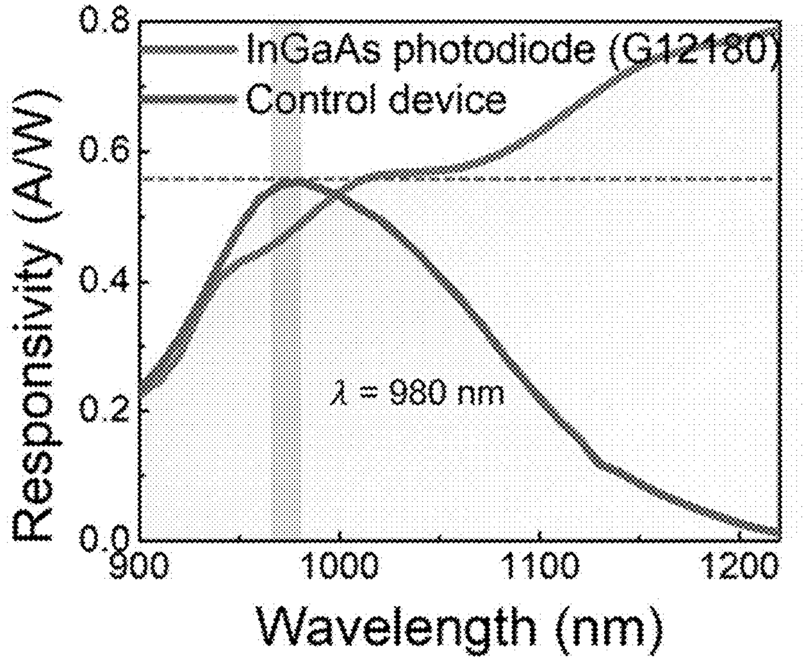
Figure 5E:
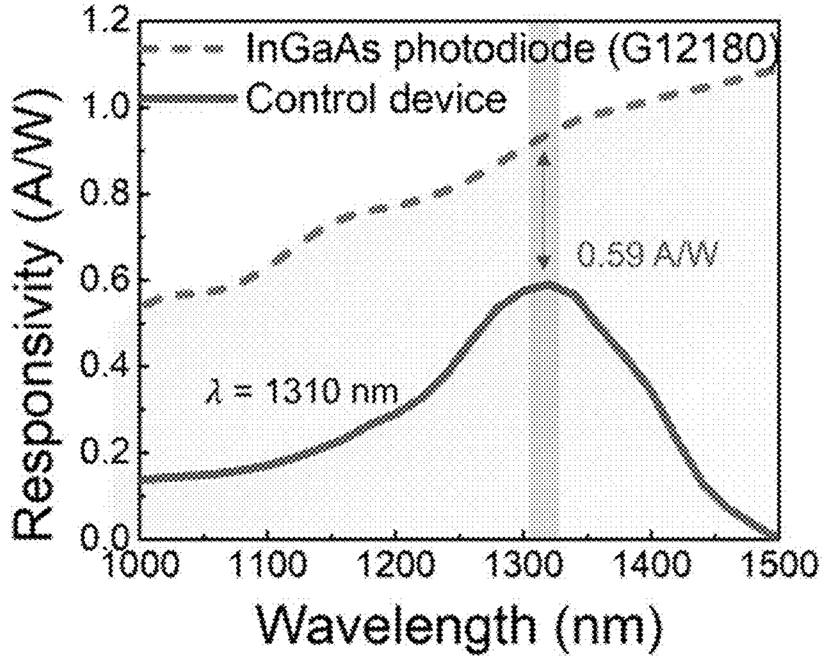

FIGS. 5D to 5E are diagrams illustrating the reactivity of an InGaAs photodiode and the NIR quantum dot photodiode according to the present embodiment under the NIR region of 980 and 1310 nm.

FIGS. 6A to 6H are diagrams illustrating the noise characteristics and detection degree of the NIR quantum dot photodiode according to present embodiment.

Figure 6A:
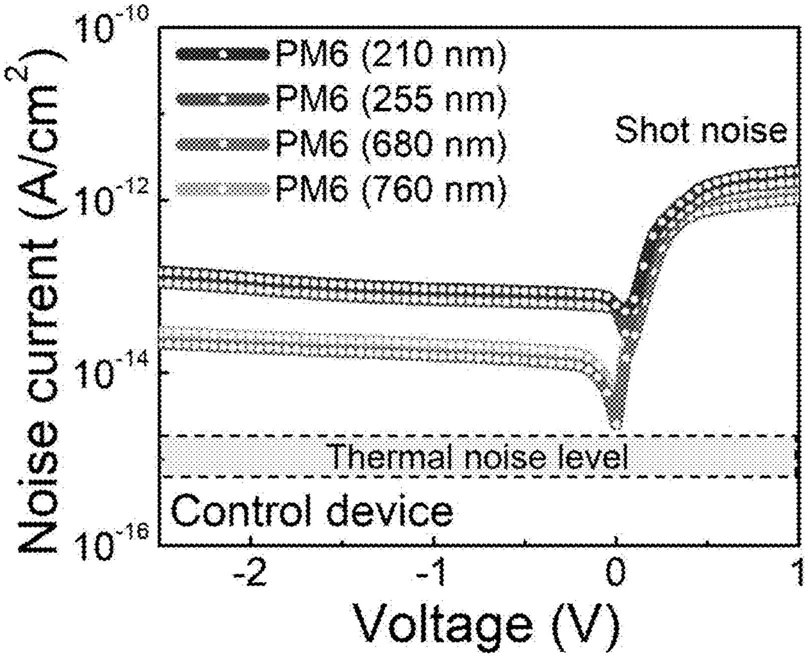
FIGS. 6A to 6H are diagrams illustrating the noise characteristics and detection degree of the NIR quantum dot photodiode according to the present embodiment.
Figure 6B:
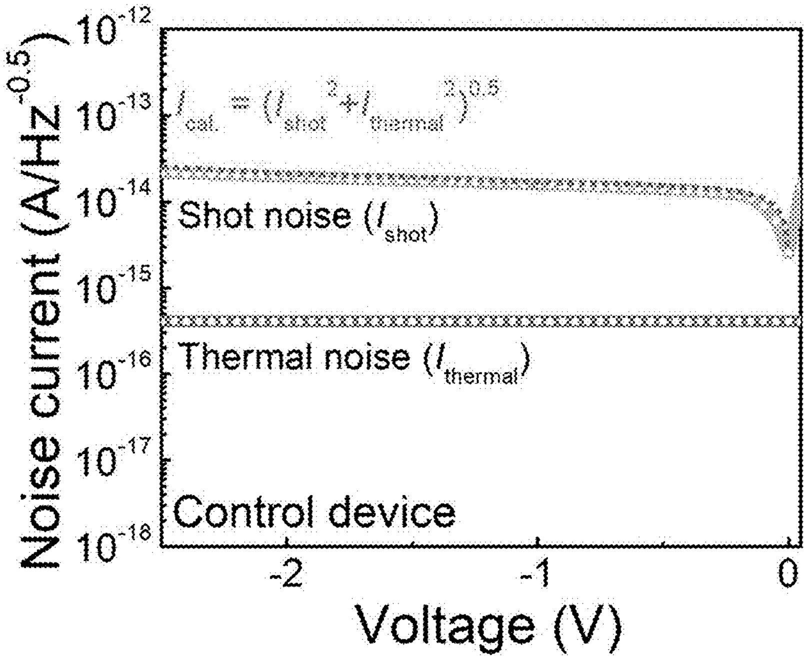

FIGS. 6A and 6B illustrate white noise and thermal noise depending on PM6 layer thickness.

As the PM6 layer becomes thicker, the white noise decreases in the same trend as dark current, and the thermal noise is at a very low level of $<10^{-16}$ A/cm$^2$, which is small enough to be ignored.

Figure 6C:
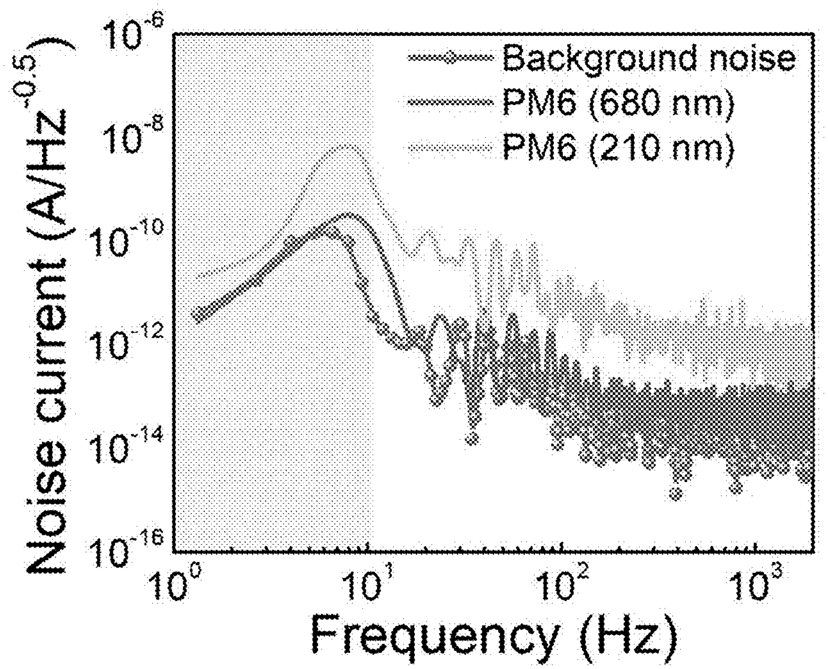

FIG. 6C is a diagram illustrating noise current versus frequency in thin and thick PM6 conditions at V→−1 V.

In FIG. 6C, the measurement sensitivity limit is the system noise (black line).

FIG. 6C is a noise current spectrum and illustrates a noise reduction rate for each different PM6 layer thickness based on background noise.

In particular, the further reduced noise level in the thick PM6 contributes to electronic blocking ability and suppression of leakage current through the reduction of defect density.

Figure 6D:
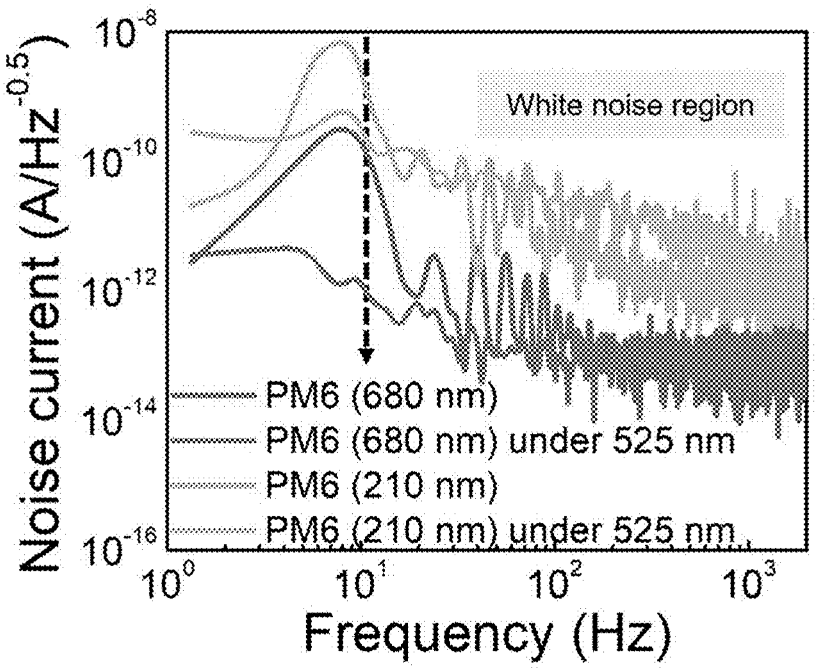

FIG. 6D is a diagram illustrating the noise density within the frequency range of 10 to 2000 Hz.

FIG. 6D illustrates the noise current spectrum before and after 525 nm light irradiation to evaluate the ability to suppress noise level due to the self-visible light filtering.

Referring to FIG. 6D, the thick PM6 layer effectively shields the visible light, minimizing unnecessary absorption and optical vibration phenomena inside the device, and shows little change in noise level before light irradiation, whereas the thin PM6 causes the transmitted light to destabilize the device, resulting in the increased noise level.

Figure 6E:
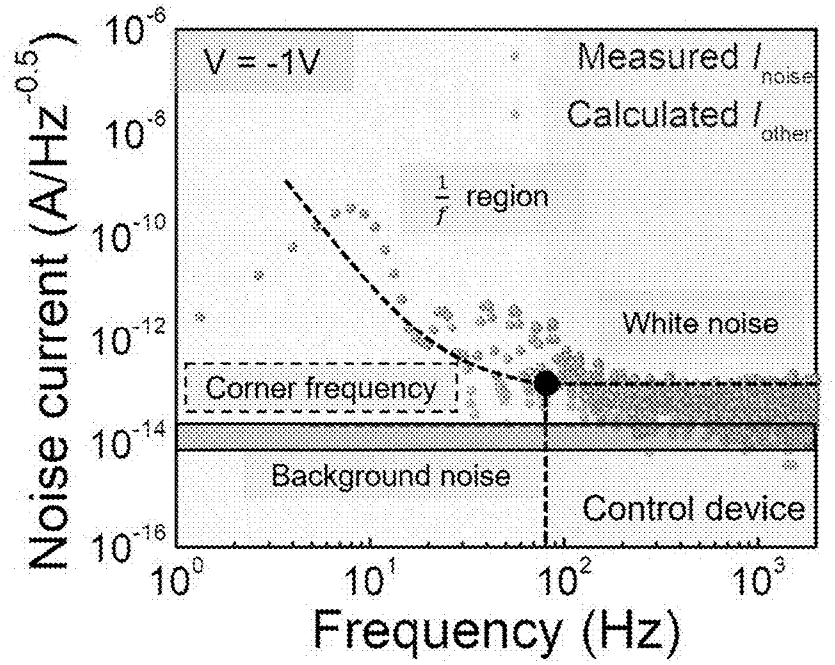
Figure 6F:
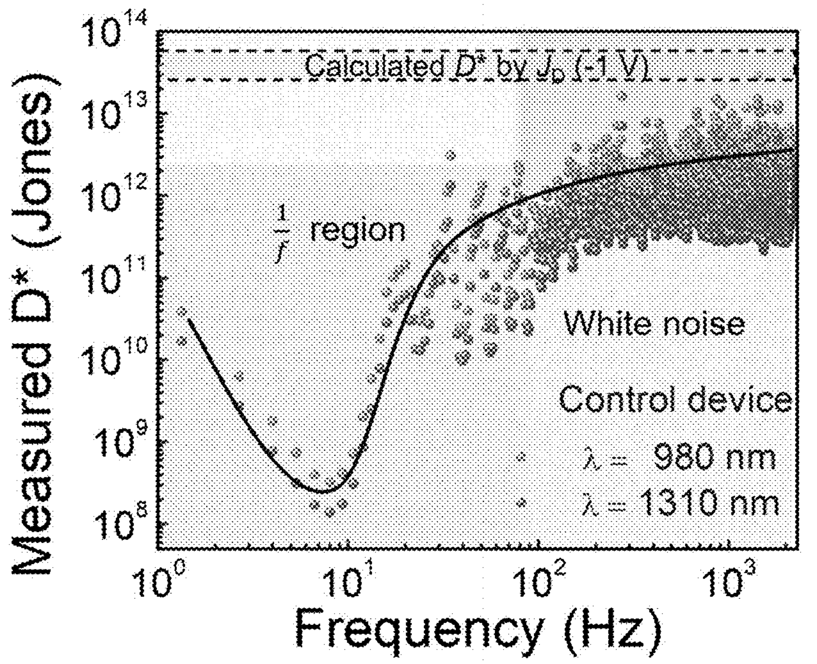
Figure 6G:
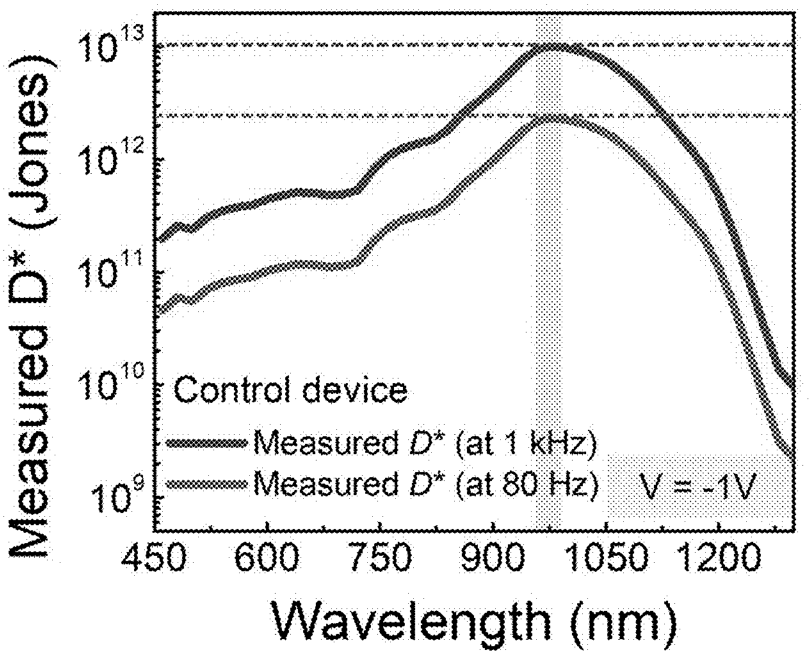
Figure 6H:
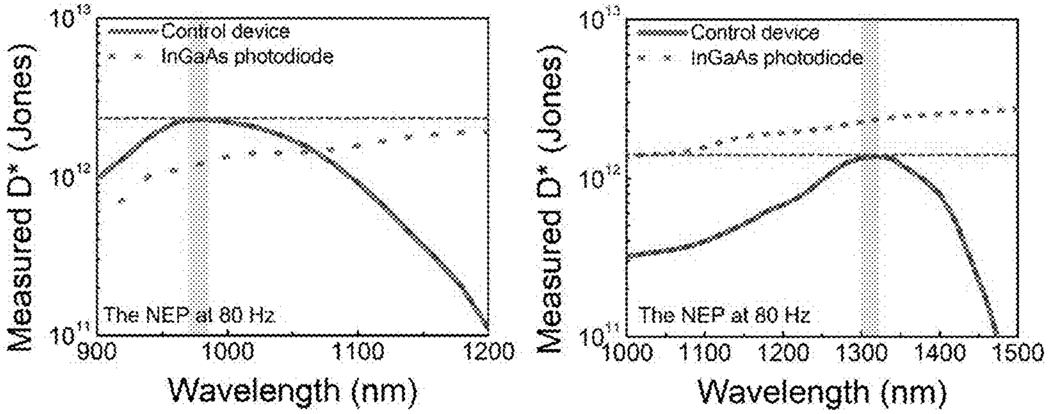

FIG. 6E is a diagram illustrating the distribution of various noise components in the noise current spectrum, FIG. 6F is a diagram illustrating the light detection degree of the control device and the distribution of each noise component in the entire measured frequency band, and FIG. 6G is a diagram illustrating the light detection degree under various frequencies of the optimized control device.

The embodiments of the present invention described above have been disclosed for illustrative purposes, and those skilled in the art with ordinary knowledge of the present invention will be able to make various modifications, changes, and additions within the spirit and scope of the present invention, and these modifications, changes, and additions should be regarded as falling within the scope of the following claims.

What is claimed is:

1. A near infrared (NIR) quantum dot photodiode, comprising:
- a transparent electrode through which visible light and near-infrared light pass;
- a p-type layer that is formed on the transparent electrode to shield the visible light;
- a quantum dot light absorption layer that is formed on the p-type layer to a preset thickness or more to generate excitons through the near-infrared light;
- an n-type layer that moves negative charges generated by the excitons; and
- an upper electrode that is formed on the n-type layer.

2. The NIR quantum dot photodiode of claim 1, wherein the p-type layer is composed of one of PM6, P3HT, PTB7, PM7, D18, and PPDT2FBT.

3. The NIR quantum dot photodiode of claim 1, wherein the quantum dot light absorption layer is formed based on PbS.

4. The NIR quantum dot photodiode of claim 1, wherein the p-type layer is formed to be 500 to 750 nm.

5. The NIR quantum dot photodiode of claim 4, wherein to determine an optimal thickness of the p-type layer, at least one of reverse dark current density, leakage current density, defect density, state trap density, capacitance, and shunt resistance is measured for various p-type layer thicknesses.

6. The NIR quantum dot photodiode of claim 5, wherein white noise and thermal noise are reduced by the optimal thickness of the p-type layer.

7. The NIR quantum dot photodiode of claim 6, wherein the p-type layer functions as an internal optical filter by the optimal thickness of the p-type layer.

8. A near infrared (NIR) quantum dot photodiode manufacturing method, comprising:

forming a transparent electrode through which visible light and near-infrared light pass;

forming a p-type layer shielding the visible light on the transparent electrode; and forming a quantum dot light absorption layer generating excitons through the near-infrared light to a preset thickness or more;

forming an n-type layer moving negative charges generated by excitons on the quantum dot light absorption layer; and forming an upper electrode on the n-type layer.

* * * * *